United States Patent [19]

Norris et al.

[11] Patent Number: 4,523,104

[45] Date of Patent: Jun. 11, 1985

[54] SWITCH DEBOUNCE CIRCUIT

[75] Inventors: Frank A. Norris; David J. Krile, both of Dayton, Ohio

[73] Assignee: The United States of America as represented by the Secretary of the Air Force, Washington, D.C.

[21] Appl. No.: 468,629

[22] Filed: Feb. 22, 1983

[51] Int. Cl.[3] .................. H03K 19/20; H03K 17/56; G08C 9/00
[52] U.S. Cl. .................. 307/247 A; 307/445; 340/365 E
[58] Field of Search .................. 307/247 A, 445; 340/365 E

[56] References Cited

U.S. PATENT DOCUMENTS

| 3,792,466 | 2/1974 | Arnold et al. | 340/365 E |
| 4,028,560 | 6/1977 | Bainter | 307/247 A |
| 4,073,131 | 2/1978 | Takase et al. | 307/247 A |
| 4,380,705 | 4/1983 | Rösler | 307/247 A |
| 4,392,065 | 7/1983 | Stiglich | 307/247 A |

Primary Examiner—Stanley D. Miller
Assistant Examiner—B. P. Davis
Attorney, Agent, or Firm—Donald J. Singer; Bernard E. Franz

[57] ABSTRACT

A circuit for eliminating transient pulses generated by bouncing mechanical contacts within a switch. A shift register accepts a series of binary input signals from the switch and propagates the signal out the register in parallel to a logic device for generating a resultant binary signal corresponding to the switch's debounced signal state.

2 Claims, 2 Drawing Figures

SWITCH DEBOUNCE CIRCUIT

RIGHTS OF THE GOVERNMENT

The invention described herein may be manufactured and used by or for the Government of the United States for all governmental purposes without the payment of any royalty.

BACKGROUND OF THE INVENTION

This invention generally relates to switching circuitry and in particular concerns debounce logic circuitry for eliminating transient and undesirable pulses generated by mechanical contacts within switches.

With pushbutton switches and keyswitches such as those found on modern keyboards, the problem of contact bounce is well known. Depression of the pushbutton abruptly causes the mechanical contacts within the switch to close and as a result of the mass of the contacts and the instantaneous force to which they are subjected, the contacts tend to bounce generating extraneous closures which may send false signals to a downstream signal processor. Under such conditions, means are advisable for determining whether the switch has been successively actuated for purposes of generating a plurality of repetitive signals or whether the sequence of contact closures was generated by contact bounce.

Prior work in this area includes U.S. Pat. No. 4,028,560 to Bainter which discloses a switch debounce circuit having a serial-to-parallel shift register with a mechanical switch and clock source input. The outputs of the shift register and the switch signal are applied to a NOR gate to obtain the debounced output. Also, U.S. Pat. No. 3,792,466 to Arnold et al teaches a debounce circuit wherein the switch and clock signals are applied to a shift register and the debounced output is obtained from an ANDNOT gate. While each of the patents is suitable for their intended purpose, neither patent combines the useage of a NAND gate and a shift register in such a simple and inexpensive manner while producing distinctive operating characteristics.

SUMMARY OF THE INVENTION

It is therefore an object of the present invention to provide a circuit for eliminating transient pulses caused by contact bounce during activation and release of a pushbutton switch.

Another object of the present invention is to provide a circuit for eliminating contact bounce while reducing wiring and logic complexities.

According to the invention, the switch to be debounced supplies a series of a high or low voltage state input signals to a serial in-parallel out shift register (controlled by a clock) whereby the register propogates parallel signals to a logic gate for generating a resultant output signal that indicates the correct steady state position of the switch.

A feature of the present invention is that only a single line connection to the switch is required for supplying both the open and closed electrical signal representations of the contact position. Another feature of the present invention is that activation of the switch causes an immediate response from the present invention indicating the closed contact position.

DETAILED DESCRIPTION OF THE INVENTION

Figure 1:
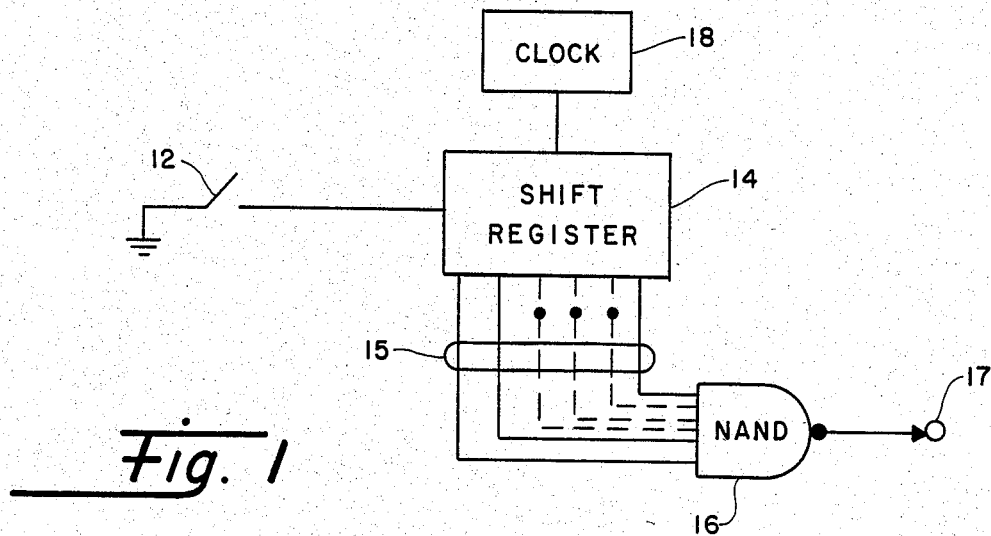
FIG. 1 is a block diagram of the preferred embodiment of the present invention.

Referring to FIG. 1, a block diagram of the preferred embodiment of the present invention is shown. A contact arm 12 is illustrated in an open position representing a typical keyswitch or pushbutton and is located between ground and a serial in-parallel out shift register 14. When the contact arm is engaged in a closed position, a signal is transitioned as an input to a shift register 14. The shift register has a plurality of output lines 15, all of which are used as inputs to a NAND gate 16. A source 17 of output signals of the NAND gate contains the correct debounced output signal. For purposes of controlling the rate of data entry into the shift register, a clock 18 for supplying clock pulses is coupled to the shift register. In this manner, the debounce logic circuitry is enabled and the shift register is stepped by the output of the clock.

Figure 2:
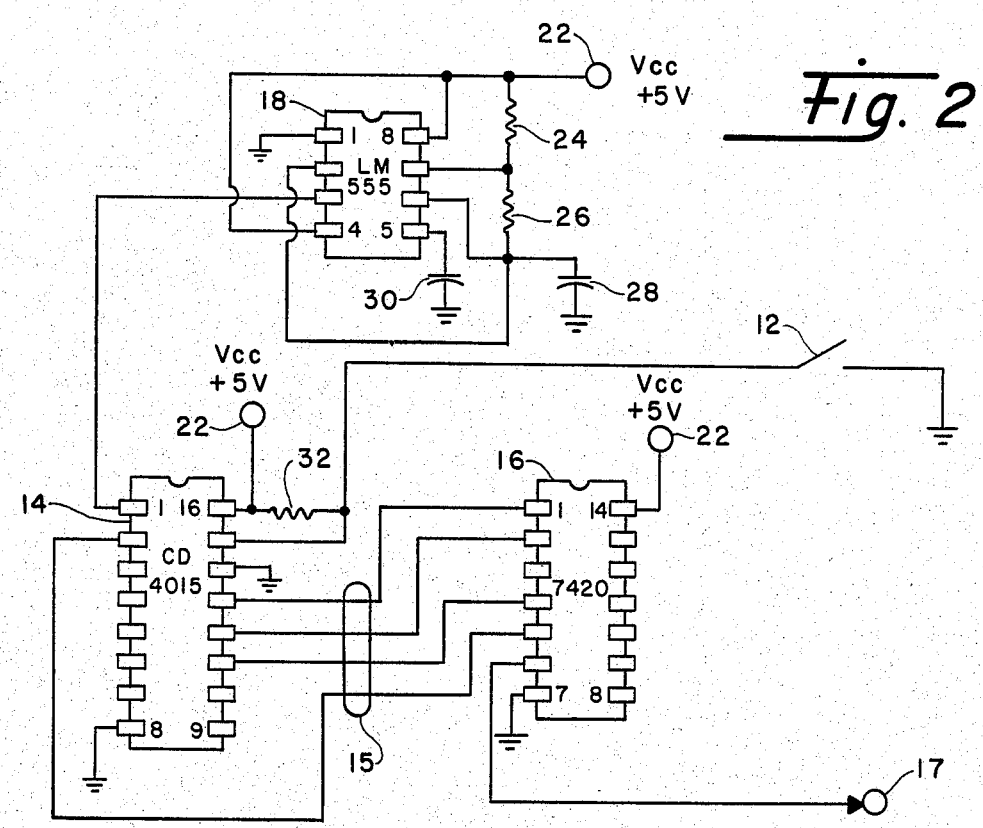
FIG. 2 is a schematic diagram of the preferred embodiment of the present invention.

The preferred schematic embodiment of the present invention is illustrated in FIG. 2. The clock of FIG. 1 is shown as clock 18 in FIG. 2, typically a LM 555 timer. Connected to the clock is the serial in-parallel out shift register 14, typically a CD 4015. Connected to the shift register is the NAND gate 16, typically a 7420. The contact arm 12 of the switch to be debounced is connected between ground and the shift register.

The clock, functioning as a voltage controlled oscillator, is controlled by several components. A supply voltage source 22, typically a +5 volts, is fed to pins 8 and 4 of the LM 555 with pin 1 serving as a ground connection. Two resistors, 24 and 26, are placed in series leading from the source of supply voltage to pin 2, with resistor 24 closest to the supply source. The junction between resistors 24 and 26 is tapped and fed to pin 7 as a selectable voltage. Likewise, a connection is made from the far side of resistor 26 to pin 6 along with a capacitor 8 from the same point to ground. Resistors 24 and 26 control the charge and discharge time of capacitor 28 and thus the clock frequency. Typically, resistor 24 is 2.7K ohms, resistor 26 is 4.7K ohms, and capacitor 28 is 0.1 $\mu f$ resulting in a clock frequency of approximately 1000 cycles/second (1 m sec) with a nominal 50% duty cycle. An additional capacitor 30, typically 0.1 $\mu f$, is connected from pin 5 to ground for reducing noise. The output signal from the clock emerges at pin 3 and is passed as an input to shift register 14.

Shift register 14, typically a CD 4015 serial in-parallel out shift register, accepts the clock signal at pin 1 and utilizes it to control the rate of data flow. Supply voltage 22, typically +5 volts, is fed to pin 16 with pins 8 and 14 connected to ground. The contact arm 12 of the switch to be debounced is connected to pin 15 providing the serialized input signal. A pull-up resistor 32, typically 10 K ohms in value, is connected from pin 16 to pin 15. With the contact arm of the switch in the open position, the +5 volt supply voltage connected to pin 16 passes through the pull-up resistor to pin 15, thus serving as an input. With the contact arm of the switch in the closed position, the +5 volt supply voltage is shunted through the pull-up resistor and through the contact arm to ground. Thus, the serialized input at pin 15 becomes the ground potential. The plurality of output lines 15 are connected from the shift register to the NAND gate 16 and comprise a line from pin 2 of the register to pin 6 of the NAND gate, from pin 11 of the register to pin 4 of the gate, from pin 12 of the register to pin 2 of the gate, and from pin 13 of the register to pin 1 of the gate. Note that for the specific embodiment in FIG. 2, the shift register has four output lines which is considered adequate for most cases, while the more generalized embodiment of FIG. 1 shows at least six output lines as being representative of the basic invention.

NAND gate 16, typically a 7420 dual gate, accepts input signals from the plurality of register output lines on pins 1, 2, 4 and 5. A supply voltage source 22, typically +5 volts, is fed to pin 14 with pin 7 connected to ground. The NAND gate functions traditionally. That is, if all of the input lines contain 0's, the output signal is a 1. If all of the input lines contain 1's, the output signal is a 0. If the input lines contain a mix of 1's and 0's, the output signal is a 1. The source 17 of output signals of the NAND gate contains the corrected debounced signal and is obtained from pin 6 of gate 16. In general, the debounced output signal is a 0 if the contact arm is open and a 1 if the contact arm is closed. In the specific embodiment of FIG. 2, the output signal is zero volts (or ground) when the contact arm is open and a positive five volts when the contact arm is closed.

Operationally, when the contact arm has been open for a consecutive number of clock pulses at least equal to the number of lines from the shift register, a 1 or high voltage state appears on all of the output lines from the shift register causing the resultant output signal of the NAND gate to be a 0 or low voltage state indicating that the contact arm is open. As the clock pulses, the shift register is stepped causing the signal that formerly appears on the first output line to now appear on a second output line. Also, the register now accepts another data entry for the first output line. If the contact arm is still open, a 1 or high voltage state appears again on the first output line from the register and the NAND gate produces a 0 or low voltage state indicating an open contact arm. This sequence continues with each clock pulse as long as the contact arm remains open. When the contact arm is closed, a 0 or low voltage state appears on the first output line from the register and the NAND gate immediately produces a 1 or high voltage state indicating a closed contact arm. It is at the next clock pulse that contact bounce is usually exhibited and during this period the output of the NAND gate is always a 1 indicating a closed contact arm. If, on this next clock pulse, the contact arm is closed, a 0 appears at the output of the shift register which, when combined with the previously generated 1's and 0's is in the NAND gate, produces a 1 at the output of the NAND gate indicating a closed contact arm. In this manner, a closed position is indicated whether the contact arm has bounced into the closed position or whether it occurred from a natural depression of the contact. If, however, the contact arm is open, a 1 appears at the output of the shift register which, when combined with the previously generated 1's and 0's in the NAND gate, produces a 1 at the output of the NAND gate indicating a closed contact arm. In this manner, the NAND gate indicates a closed contact arm when the contact arm is open for that very short period of time during which contact bounce is likely to occur. This situation is counteracted when the contact arm remains open for a consecutive number of clock pulses equal to the number of output lines from the shift register. Accordingly, the previously generated signals will propogate completely through the register and all the output lines will then contain 1's or the high voltage state. When all 1's appear as inputs to the NAND gate, the gate produces a 0 indicating that the contact arm is in the open position.

As the frequency of the clock is, typically, one pulse every millisecond, the time involved to utilize the present invention is exceedingly short. Accordingly, the time delay involved in resetting the circuitry to accept a valid input signal is deemed insignificant, while the ability of the present invention to respond instantaneously to a valid input is considered to be a desirable feature.

For the preferred embodiment of FIG. 2, the high voltage state is a positive five volts while the low voltage state is zero volts (or ground potential). It should be noted that other voltages would also be acceptable. Likewise, the input voltage to the shift register could also be different, even to the point where the open position of the switch is a 0 and the closed position is a 1. This, of course, would require the use of a NOR gate in order to maintain the quick reaction on closing and a delayed reaction on opening of the switch. Naturally, an AND gate could be used in place of the NAND gate, and an OR gate could be used in place of a NOR gate, by simply interpreting the output in the opposite sense.

It is also possible to arrange the circuit to obtain a quick reaction on opening of the switch, with the delayed reaction occurring on closing, for example by using a NOR gate with the logic levels shown in the drawing, or by using 0 and for open and closed respectively with the NAND gate.

Thus, while preferred constructional features are embodied in the structure illustrated herein, it is to be understood that changes and variations may be made by the skilled in the art without departing from the spirit and scope of the invention.

We claim:

1. A circuit for eliminating the transient electrical effects of contact bounce occuring within a switch, for use with a single pole, single throw switch having only two contact members, one of which is a movable contact lever which engages the other contact member, the switch being closed when the two contact members are engaged and being open when the two contact members are separated, the switch having a control member having first and second positions for moving the contact members to be closed and open respectively, with bouncing between open and closed for a time after changing the position of the control member, there being a single direct-current bias source having a supply lead and a ground lead, wherein said circuit comprises:

a. a clock circuit comprising of a single integrated circuit clock chip having a predetermined clock frequency, at least one terminal of the clock chip being connected to said supply lead, one terminal of the chip being connected to the ground lead, and one terminal of the clock chip being an output terminal for the clock signal, the clock circuit being operative to produce a continuous train of clock pulses at its output terminal at a frequency providing a period of approximately one millisecond per clock pulse;

b. a shift register comprising a single integrated register circuit chip, having N stages and N parallel output terminals, N being at least four, a serial input terminal, the shift register being connected to operate in a serial input mode with output to said N parallel output terminals, one terminal of the register chip being connected to said supply lead, one terminal of the register chip being connected to the ground lead, said switch having one contact member connected to the ground lead and its other contact member connected directly to said serial input terminal, a pull-up resistor connected between the supply lead and the serial input terminal, the potential supplied via the pull-up resistor being a first logic state which appears at said serial input terminal responsive to the switch being open, and ground potential being a second logic state which appears at the serial input terminal responsive to the switch being closed, one terminal of the register chip being a clock input which is connected to said output terminal of the clock chip, the shift register being operative to advance once for each clock pulse to set its first stage to the logic state at the serial input terminal and the oter stages each to the state of the preceeding stage;

c. a gate device consisting of at least part of a gate chip, which is a single integrated circuit chip, having N input terminals connected respectively to the N parallel output terminals of the register chip, one terminal of the gate chip being connected to said supply lead, one terminal of the gate chip being connected to the ground lead, the gate chip having a gate output terminal for supplying an output signal indicative of the position of the switch, the gate being a coincidence device in which the logic state at the gate output terminal depends on wheter or not all N input terminals are at the same given one of said logic states.

2. The circuit according to claim 1, wherein said given logic state is the first logic state, so that when the control member of the switch is moved to the first position and the contact members initially close, the logic state at the first of the N input terminals becomes the second logic state on the next clock pulse and the signal at the gate output terminal substantially immediately indicates the closed condition of the switch, and cannot indicate an open condition until the contact members have remained closed for N clock pulses.

* * * * *

UNITED STATES PATENT AND TRADEMARK OFFICE
CERTIFICATE OF CORRECTION

PATENT NO. : 4,523,104

DATED : June 11, 1985

INVENTOR(S) : Frank A. Norris et al

It is certified that error appears in the above-identified patent and that said Letters Patent is hereby corrected as shown below:

At column 2, line 44, "8" should be -- 28 --.

At column 3, line 37, "appears" should be -- appeared --.

At column 5, line 23, "oter" should be -- other --.

At column 6, line 11, "wheter" should be -- whether --.

Signed and Sealed this

Twenty-ninth Day of October 1985

[SEAL]

Attest:

DONALD J. QUIGG

Attesting Officer

Commissioner of Patents and
Trademarks—Designate